(12) United States Patent
He et al.

(10) Patent No.: US 12,490,584 B2
(45) Date of Patent: Dec. 2, 2025

(54) LIGHT-EMITTING DEVICE WITH IMPROVED LUMINOUS EFFICIENCY AND MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Baoke He, Beijing (CN); Duanming Li, Beijing (CN); Minghao Gao, Beijing (CN); Quanqin Sun, Beijing (CN); Guanjun Huang, Beijing (CN); Qin Zhang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 438 days.

(21) Appl. No.: 17/788,635

(22) PCT Filed: Sep. 1, 2021

(86) PCT No.: PCT/CN2021/115940
§ 371 (c)(1),
(2) Date: Jun. 23, 2022

(87) PCT Pub. No.: WO2022/088949
PCT Pub. Date: May 5, 2022

(65) Prior Publication Data
US 2023/0022371 A1    Jan. 26, 2023

(30) Foreign Application Priority Data
Oct. 28, 2020   (CN) .......................... 202011172405.5

(51) Int. Cl.
*H10K 50/844*   (2023.01)
*H10K 59/80*    (2023.01)

(52) U.S. Cl.
CPC ..... *H10K 50/8445* (2023.02); *H10K 59/8731* (2023.02); *H10K 59/879* (2023.02); *H10K 59/876* (2023.02)

(58) Field of Classification Search
CPC ... H10K 50/844; H10K 50/852; H10K 50/858
See application file for complete search history.

(56) References Cited

U.S. PATENT DOCUMENTS

2004/0217370 A1   11/2004   Negley
2007/0113881 A1    5/2007   Mellott et al.
(Continued)

FOREIGN PATENT DOCUMENTS

CN   1816917 A    8/2006
CN   105470405 A  4/2016
(Continued)

*Primary Examiner* — Nduka E Ojeh
(74) *Attorney, Agent, or Firm* — The Webb Law Firm (57) ABSTRACT

Provided are a light-emitting device and a manufacturing method thereof, and a display device, and relates to the field of display technology. The light-emitting device includes: a light-emitting unit located on one side of a backplane; and an encapsulation layer located on one side of the light-emitting unit away from the backplane. The encapsulation layer includes: a first inorganic layer; a second inorganic layer located on one side of the first inorganic layer away from the backplane; an organic layer located between the first inorganic layer and the second inorganic layer; and a third inorganic layer located between the first inorganic layer and the organic layer. The refractive index of the first inorganic layer, the refractive index of the third inorganic layer, and the refractive index of the organic layer decrease sequentially.

17 Claims, 3 Drawing Sheets

(56) References Cited

U.S. PATENT DOCUMENTS

| | | |
|---|---|---|
| 2012/0193636 A1 | 8/2012 | Stern |
| 2014/0138636 A1* | 5/2014 | Song .................. H10K 59/876 |
| | | 257/40 |
| 2016/0093828 A1* | 3/2016 | Kim .................. H10K 59/8731 |
| | | 257/40 |
| 2016/0155979 A1* | 6/2016 | Yim .................... H10K 59/878 |
| | | 257/40 |
| 2016/0190519 A1* | 6/2016 | Cho .................. H10K 59/8731 |
| | | 438/31 |
| 2018/0013100 A1* | 1/2018 | Yim .................. H10K 59/8731 |
| 2018/0040854 A1* | 2/2018 | Sung ...................... H10K 59/12 |
| 2018/0151843 A1* | 5/2018 | Ma ......................... H10K 59/40 |
| 2019/0140211 A1* | 5/2019 | Nishizaki ............. H10K 50/844 |
| 2020/0083490 A1 | 3/2020 | Zhang |
| 2020/0091462 A1 | 3/2020 | Huang |
| 2020/0203663 A1* | 6/2020 | Ju ....................... H10K 85/654 |
| 2020/0235330 A1 | 7/2020 | Chen et al. |
| 2021/0057679 A1 | 2/2021 | Xie et al. |
| 2021/0066660 A1 | 3/2021 | Kishimoto |
| 2021/0234124 A1 | 7/2021 | Li et al. |
| 2021/0408504 A1 | 12/2021 | Geng et al. |

FOREIGN PATENT DOCUMENTS

| | | |
|---|---|---|
| CN | 107591493 A | 1/2018 |
| CN | 107863447 A | 3/2018 |
| CN | 108539041 A | 9/2018 |
| CN | 108899438 A | 11/2018 |
| CN | 208444841 U | 1/2019 |
| CN | 109755407 A | 5/2019 |
| CN | 109841758 A | 6/2019 |
| CN | 109920938 A | 6/2019 |
| CN | 110299388 A | 10/2019 |
| CN | 110534553 A | 12/2019 |
| CN | 111710797 A | 9/2020 |
| WO | 2019186825 A1 | 10/2019 |

* cited by examiner

LIGHT-EMITTING DEVICE WITH IMPROVED LUMINOUS EFFICIENCY AND MANUFACTURING METHOD THEREOF, AND DISPLAY DEVICE

CROSS-REFERENCE TO RELATED APPLICATIONS

The present disclosure is a U.S. National Stage Application under 35 U.S.C. § 371 of International Patent Application No. PCT/CN2021/115940, filed on Sep. 1, 2021, which is based on and claims priority to Chinese Patent Application No. 202011172405.5 filed on Oct. 28, 2020, the disclosures of which are incorporated by reference herein in their entirety.

TECHNICAL FIELD

The present disclosure relates to a light-emitting device and a manufacturing method thereof, and a display device.

BACKGROUND

With the development of display technology, the organic light-emitting diode (OLED) has developed rapidly due to its own advantages.

For a light-emitting device such as OLED, luminous efficiency is an index for evaluating the performance of the light-emitting device.

SUMMARY

According to one aspect of the embodiments of the present disclosure, a light-emitting device is provided. The device comprises: a light-emitting unit located on one side of a backplane; and an encapsulation layer located on one side of the light-emitting unit away from the backplane. The encapsulation layer comprises: a first inorganic layer; a second inorganic layer located on one side of the first inorganic layer away from the backplane; an organic layer located between the first inorganic layer and the second inorganic layer; and a third inorganic layer located between the first inorganic layer and the organic layer, wherein a refractive index of the first inorganic layer, a refractive index of the third inorganic layer, and a refractive index of the organic layer decrease sequentially.

In some embodiments, the third inorganic layer comprises at least one layer, each layer of the at least one layer having a refractive index of n1; each layer of the at least one layer is adjacent to two layers of the first inorganic layer, the at least one layer and the organic layer, the two layers having refractive indices of n2 and n3 respectively; and an absolute value of a difference between $(n1)^2$ and $(n2 \times n3)$ is greater than or equal to 0, and smaller than 0.1.

In some embodiments, the at least one layer only comprises one layer.

In some embodiments, each layer of the at least one layer has a thickness of $d=(2K+1)*\lambda/4$, where K is an integer, and $\lambda$ is a wavelength of light emitted by the light-emitting unit.

In some embodiments, an absolute value of a difference between refractive indices of two adjacent layers of the first inorganic layer, the at least one layer and the organic layer ranges from 0.01 to 0.1.

In some embodiments, each layer of the at least one layer has the refractive index ranging from 1.45 to 1.76.

In some embodiments, the at least one layer comprises: a first layer having a refraction index ranging from 1.57 to 1.76; and a second layer located between the first layer and the organic layer, the second layer having a refractive index ranging from 1.45 to 1.55.

In some embodiments, the first inorganic layer has the refractive index ranging from 1.7 to 2; and the organic layer has the refractive index ranging from 1.45 to 1.55.

In some embodiments, a ratio of the thickness of each layer of the at least one layer to a thickness of the first inorganic layer ranges from 1:8 to 1:12.

In some embodiments, the thickness of each of the at least one layer ranges from 20 nanometers to 200 nanometers.

In some embodiments, the at least one layer comprises: a first layer having a thickness ranging from 50 nanometers to 200 nanometers; and a second layer located between the first layer and the organic layer.

In some embodiments, the first inorganic layer has the thickness ranging from 500 nanometers to 1500 nanometers; and the organic layer has a thickness ranging from 4 micrometers to 16 micrometers.

In some embodiments, a material of the third inorganic layer comprises silicon oxynitride.

In some embodiments, a material of the first inorganic layer comprises silicon oxynitride.

In some embodiments, the light-emitting unit comprises a microcavity structure, the microcavity structure comprising: an anode located on the one side of the backplane; a light-emitting layer located on one side of the anode away from the backplane; a cathode located on one side of the light-emitting layer away from the anode; and a light extraction layer located on one side of the cathode away from the light-emitting layer, wherein a refractive index of the light extraction layer is smaller than the refractive index of the organic layer.

In some embodiments, a surface of the third inorganic layer in contact with the organic layer has a protrusion.

In some embodiments, arithmetic mean deviation of the contour of the surface is greater than 10 nanometers.

According to another aspect of the embodiments of the present disclosure, provided is a display device, comprising: a plurality of pixel units, wherein at least one of the plurality of pixel units comprises the light-emitting device according to any one of the above embodiments; and the backplane, the plurality of pixel units being located on the one side of the backplane.

According to still another aspect of the embodiments of the present disclosure, provided is a manufacturing method of a light-emitting device, comprising: forming a light-emitting unit on one side of a backplane; and forming an encapsulation layer on one side of the light-emitting unit away from the backplane, comprising: forming a first inorganic layer, forming a third inorganic layer on one side of the first inorganic layer away from the backplane, forming an organic layer on one side of the third inorganic layer away from the first inorganic layer, and forming a second inorganic layer on one side of the organic layer away from the third inorganic layer, wherein a refractive index of the first inorganic layer, a refractive index of the third inorganic layer, and a refractive index of the organic layer decrease sequentially.

In some embodiments, forming the third inorganic layer comprises: forming the third inorganic layer by using a chemical vapor deposition process, wherein a power applied during a process of forming the third inorganic layer changes from a value not 0 to 0 at a certain time, so that a surface of the third inorganic layer in contact with the organic layer has a protrusion.

Other features, aspects and advantages of the present disclosure will become apparent from the following detailed description of exemplary embodiments of the present disclosure with reference to the accompanying drawings.

BRIEF DESCRIPTION OF THE ACCOMPANYING DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, in order to improve the luminous efficiency of the light-emitting device, the layer structure below an encapsulation layer of the light-emitting device is adjusted.

The inventors have noticed that, improvement of the luminous efficiency is limited with this manner, which involves high difficulty in implementation and high cost.

In order to further improve the luminous efficiency of the light-emitting device, the embodiments of the present disclosure provide the following technical solutions.

The inventors of the present disclosure have found through studies that, the luminous efficiency and color shift of the light-emitting device can be adjusted by adjusting the relationship between the refractive indices of the organic layer and the inorganic layer in the encapsulation layer of the light-emitting device. Accordingly, the embodiments of the present disclosure provide the following technical solutions.

Figure 1:
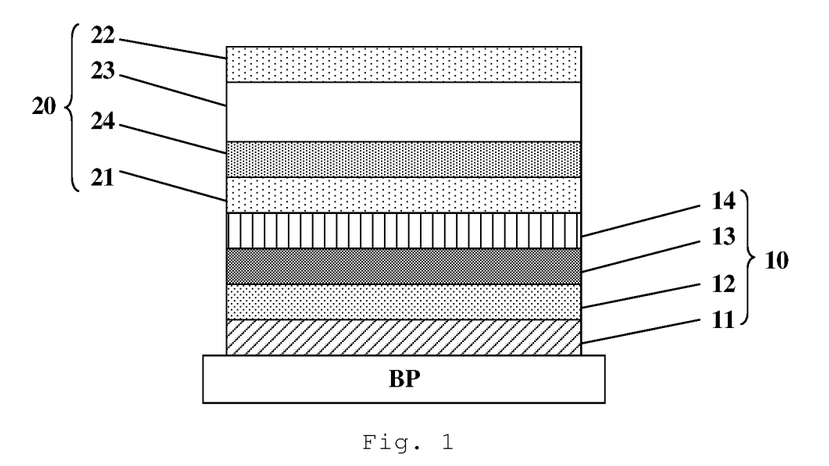
FIG. 1 is a schematic structural view showing a light-emitting device according to an embodiment of the present disclosure.

FIG. 1 is a schematic structural view showing a light-emitting device according to an embodiment of the present disclosure.

As shown in FIG. 1, the light-emitting device may comprise a light-emitting unit 10 and an encapsulation layer 20.

The light-emitting unit 10 is located on one side of a backplane BP. Here, the backplane BP may be provided with a driving circuit for driving the light-emitting device to emit light. The driving circuit may comprise members such as a thin film transistor and a capacitor. The light-emitting unit 10 may comprise, for example, a red light-emitting unit R, a green light-emitting unit G, or a blue light-emitting unit B. In some embodiments, the light-emitting unit 10 may be an OLED.

The encapsulation layer 20 is located on one side of the light-emitting unit 10 away from the backplane BP. The encapsulation layer 20 may be, for example, a thin film encapsulation layer. The encapsulation layer 20 comprises a first inorganic layer 21, a second inorganic layer 22, an organic layer 23 and a third inorganic layer 24. The second inorganic layer 22 is located on one side of the first inorganic layer 21 away from the backplane BP, the organic layer 23 is located between the first inorganic layer 21 and the second inorganic layer 22, and the third inorganic layer 24 is located between the first inorganic layer 21 and the organic layer 23. The refractive index of the first inorganic layer 21, the refractive index of the third inorganic layer 24, and the refractive index of the organic layer 23 decrease sequentially.

In some embodiments, the material of the third inorganic layer 24 comprises silicon oxynitride. In some embodiments, the material of the first inorganic layer 21 comprises silicon oxynitride. In some embodiments, the material of the second inorganic layer 22 comprises silicon nitride.

In the above embodiments, in the encapsulation layer 20, the refractive index of the first inorganic layer 21, the refractive index of the third inorganic layer 24 and the refractive index of the organic layer 23 decrease sequentially. Such an encapsulation layer 20 is favorable for improving the transmittance of light, thereby improving the luminous efficiency of the light-emitting device. In addition, such an encapsulation layer 20 is also favorable for reducing the color shift of the light-emitting device.

Figure 2:
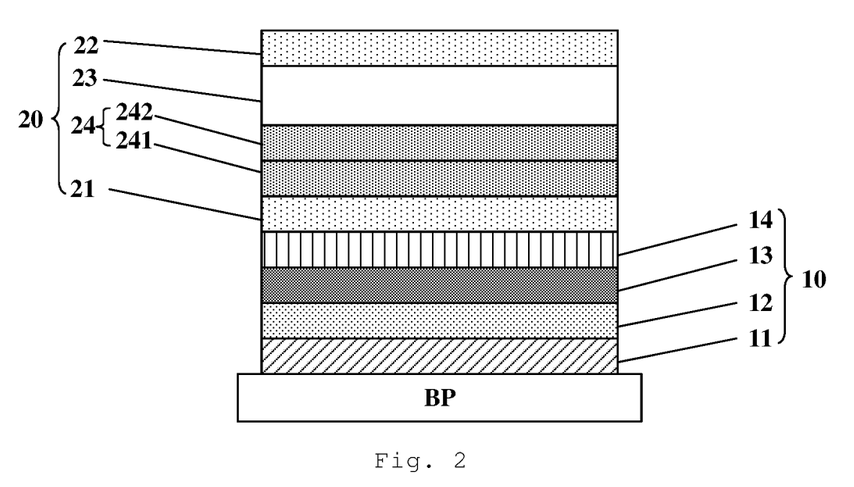
FIG. 2 is a schematic structural view showing a light-emitting device according to another embodiment of the present disclosure.

The third inorganic layer 24 in the encapsulation layer 20 comprises at least one layer. For example, the third inorganic layer 24 only comprises one layer, as shown in FIG. 1. For another example, the third inorganic layer 24 comprises a plurality of layers, for example two or more layers, as shown in FIG. 2. In some embodiments, in a case where the third inorganic layer 24 comprises a plurality of layers, the refractive indices of the plurality of layers of the third inorganic layer 24 gradually decrease in a direction from the backplane BP to the light-emitting unit 10.

FIG. 2 is a schematic structural view showing a light-emitting device according to another embodiment of the present disclosure.

As shown in FIG. 2, the third inorganic layer 24 comprises a first layer 241 and a second layer 242 located between the first layer 241 and the organic layer 23. It should be understood that, the third inorganic layer 24 may also comprise more layers other than the first layer 241 and the second layer 242.

Some implementations of the refractive indices of the first inorganic layer 21, the third inorganic layer 24 and the organic layer 23 will be described below.

Hereinafter, for the ease of description, the refractive index of each layer of the third inorganic layer 24 is defined as n1. The refractive indices of two layers of the first inorganic layer 21, the at least one layer of the third inorganic layer 24 and the organic layer 23 that are adjacent to each layer of the third inorganic layer 24 are defined as n2 and n3.

For example, in a case where the third inorganic layer 24 only comprises one layer, the two layers adjacent to the third inorganic layer 24 are the first inorganic layer 21 and the organic layer 23.

For another example, in a case where the third inorganic layer 24 comprises two layers, the two layers adjacent to one of the two layers of the third inorganic layer 24 are one of the first inorganic layer 21 and the organic layer 23, and the other of the two layers of the third inorganic layer 24.

For still another example, in a case where the third inorganic layer 24 comprises three layers, the two layers adjacent to a middle layer of the three layers of the third inorganic layer 24 are the other two layers of the three layers, and the two layers adjacent to one of the other two layers than the middle layer of the third inorganic layer 24 are one of the first inorganic layer 21 and the organic layer 23, and the other of the other two layers of the third inorganic layer 24.

In some embodiments, the absolute value of the difference between $(n1)^2$ and $(n2 \times n3)$ is greater than or equal to 0, and smaller than 0.1. In this way, each layer in the third inorganic layer 24 of the encapsulation layer 20 is favorable for improving the transmittance of light, and the luminous efficiency of the light-emitting device is further improved. As some implementations, the difference between $(n1)^2$ and $(n2 \times n3)$ is 0.03, 0.05, 0.07, etc.

The inventors have also noticed that, the transmittance of light can be further improved by adjusting the difference between the refractive indices of two adjacent layers. In some embodiments, the absolute value of the difference between two adjacent layers of the refractive indices of the first inorganic layer 21, the at least one layer of the third inorganic layer 24 and the organic layer 23 ranges from 0.01 to 0.1, for example, is 0.04, 0.06, etc. In this way, the transmittance of light is further improved.

For example, in the case where the third inorganic layer 24 only comprises one layer, the absolute value of the difference between the refractive index of the first inorganic layer 21 and the refractive index of the third inorganic layer 24 ranges from 0.01 to 0.1, and the absolute value of the difference between the refractive index of the organic layer 23 and the refractive index of the third inorganic layer 24 ranges from 0.01 to 0.1.

For another example, in the case where the third inorganic layer 24 comprises a plurality of layers, the absolute value of the difference between the refractive index of one layer of the third inorganic layer 24 adjacent to the first inorganic layer 21 and the refractive index of the first inorganic layer 21 ranges from 0.01 to 0.1, the absolute value of the difference between the refractive index of one layer of the third inorganic layer 24 adjacent to the organic layer 23 and the refractive index of the organic layer 23 ranges from 0.01 to 0.1, and the absolute value of the difference between the refractive indices of two adjacent layers (if exist) in the third inorganic layer 24 ranges from 0.01 to 0.1.

In some embodiments, the refractive index of each layer of the third inorganic layer 24 ranges from 1.45 to 1.76. For example, in the case where the third inorganic layer 24 comprises the first layer 241 and the second layer 242 shown in FIG. 2, the refractive index of the first layer 241 ranges from 1.57 to 1.76, for example, is 1.6, 1.65, 1.7, etc. The refractive index of the second layer 242 located between the one layer 241 and the organic layer 23 ranges from 1.45 to 1.55, for example, is 1.5, 1.52, etc.

In some embodiments, the refractive index of each layer of the third inorganic layer 24 ranges from 1.45 to 1.76, for example, is 1.5, 1.6, 1.63, 1.7, etc. The refractive index of the first inorganic layer 21 ranges from 1.7 to 2, for example, is 1.73, 1.8, 1.9, etc. The refractive index of the organic layer 23 ranges from 1.45 to 1.55, for example, is 1.47, 1.5, 1.52, etc. In some embodiments, the refractive index of the second inorganic layer 22 ranges from 1.8 to 1.9, for example, is 1.84, 1.85, etc.

In some embodiments, the absolute value of the difference between $(n1)^2$ and $(n2 \times n3)$ is greater than or equal to 0, and smaller than 0.1, and each layer of the third inorganic layer 24 has a thickness of $d=(2K+1)*\lambda/4$, where K is an integer, and $\lambda$ is a wavelength of the light emitted by the light-emitting unit 10. In this way, each layer in the third inorganic layer 24 of the encapsulation layer 20 is more favorable for improving the transmittance of light, and the light-emitting efficiency of the light-emitting device can be further improved.

The inventors have found through further studies that, the transmittance of light can be further improved by adjusting the ratio of the thickness of each layer in the third inorganic layer 24 to the thickness of the first inorganic layer 21. In some embodiments, the ratio of the thickness of each layer of the third inorganic layer 24 to the thickness of the first inorganic layer 21 ranges from 1:8 to 1:12, for example, is 1:4, 1:6, 1:10, etc. In this way, the transmittance of light can be further improved.

In some embodiments, the thickness of each layer of the third inorganic layer 24 ranges from 20 nanometers to 200 nanometers, for example, is 40 nanometers, 80 nanometers, 150 nanometers, etc. For example, the thickness of the first layer 241 shown in FIG. 2 ranges from 50 nanometers to 200 nanometers, for example, is 100 nanometers, 150 nanometers, 180 nanometers, etc. The thickness of the second layer 242 located between the first layer 241 and the organic layer 23 ranges from 20 nanometers to 200 nanometers.

In some embodiments, the thickness of each layer of the third inorganic layer 24 ranges from 20 nanometers to 200 nanometers, for example, is 40 nanometers, 80 nanometers, 150 nanometers, etc. The thickness of the first inorganic layer ranges from 500 nanometers to 1500 nanometers, for example, is 600 nanometers, 800 nanometers, 900 nanometers, 1000 nanometers, 1200 nanometers, etc. The thickness of the organic layer 23 ranges from 4 micrometers to 16 micrometers, for example, is 6 micrometers, 8 micrometers, 10 micrometers, 12 micrometers, etc. In some embodiments, the thickness of the second inorganic layer 22 ranges from 500 nanometers to 800 nanometers, for example, is 600 nanometers, 700 nanometers, etc.

In some embodiments, the organic layer 23 is formed by an inkjet printing process, and the raw material for forming the organic layer 23 may comprise, for example, organic ink. The inventors have noticed that, the reduction in thickness of the organic layer 23 is favorable for saving the cost, but the reduction in thickness may result in poor flatness of the organic layer 23, which in turn results in poor display when the light-emitting device is applied to a display device.

In view of the above problems, the embodiments of the present disclosure also provide the following solutions.

Figure 3:
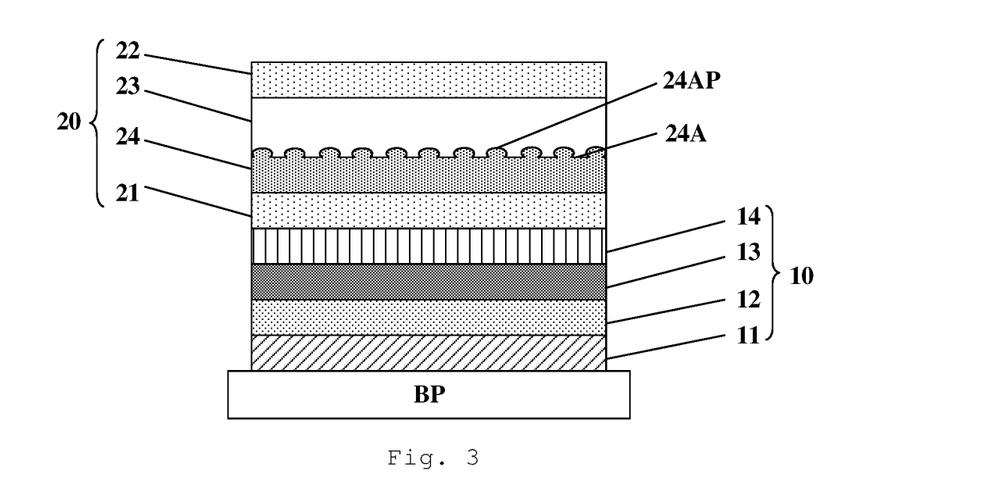
FIG. 3 is a schematic structural view showing a light-emitting device according to a further embodiment of the present disclosure.

FIG. 3 is a schematic structural view showing a light-emitting device according to a further embodiment of the present disclosure.

Compared with the embodiment shown in FIG. 1, the surface 24A of the third inorganic layer 24 shown in FIG. 3 in contact with the organic layer 23 has a protrusion 24AP. In some embodiments, the number of protrusions 24AP may be more than one. The presence of the protrusion 24AP is favorable for promoting the flow of the raw material for forming the organic layer 23, so that the organic layer 23 still have a surface with high flatness in a case of having reduced thickness.

In some embodiments, the arithmetic mean deviation of the contour (simply referred to as Ra) of the surface 24A of the third inorganic layer 24 in contact with the organic layer 23 is greater than 10 nanometers, for example, is 12 nanometers, 15 nanometers, 20 nanometers, etc. In this way, the organic layer 23 can be ensured to have flatness in a case of having reduced thickness. For example, in a case where the arithmetic mean deviation of the contour of the surface 24A is about 15 nanometers, the diffusion distance of the organic ink within the same time is about 800 micrometers, and in a case where the thickness of the organic layer 23 is 4 micrometers, poor display will not be resulted in.

Figure 4:
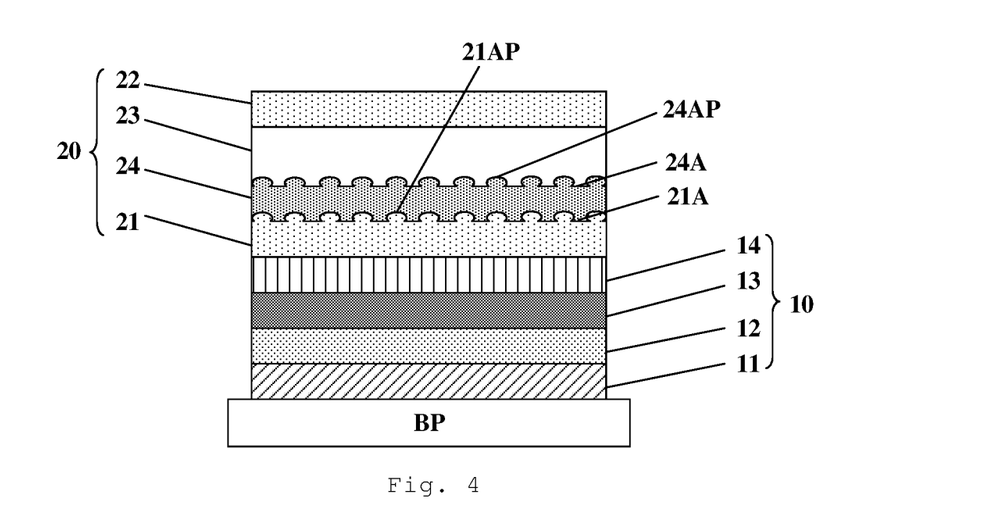
FIG. 4 is a schematic structural view showing a light-emitting device according to still another embodiment of the present disclosure.

FIG. 4 is a schematic structural view showing a light-emitting device according to still another embodiment of the present disclosure.

Compared with the embodiment shown in FIG. 3, the surface 21A of the first inorganic layer 21 in contact with the third inorganic layer 24 shown in FIG. 4 has a protrusion 21AP. In some embodiments, the number of protrusions 21AP may be more than one.

In the case shown in FIG. 4, the third inorganic layer 24 may be conformally formed on the surface 21A of the first inorganic layer 24, so that the surface 24A of the third inorganic layer 24 in contact with the organic layer 23 has a protrusion 24AP.

In some embodiments, referring to FIGS. 2 to 4, the light-emitting unit 10 may comprise a microcavity structure. Here, the microcavity structure comprises an anode 11 located on one side of the backplane BP, a light-emitting layer 12 located on one side of the anode 11 away from the backplane BP, a cathode 13 located on one side of the light-emitting layer 12 away from the anode 11, and a light extraction layer 14 located on one side of the cathode 13 away from the light-emitting layer. In some embodiments, the microcavity structure of the light-emitting unit 10 further comprises one or more layers of a hole transport layer, a hole injection layer, an electron transport layer, and an electron injection layer.

Here, the refractive index of the light extraction layer 14 is smaller than the refractive index of the organic layer 23. In some embodiments, the refractive index of light extraction layer 14 ranges from 1.3 to 1.5, for example, is 1.35, 1.4, 1.45, etc.

In some embodiments, the material of the light extraction layer 14 may comprise lithium fluoride (LiF), silicon oxide (for example, silicon dioxide), aluminum oxide, etc. In some embodiments, the thickness of the light extraction layer 14 is greater than 0 nanometer, smaller than or equal to 100 nanometers, for example, is 20 nanometers, 50 nanometers, 80 nanometers, etc.

In some embodiments, the material of light-emitting layer 12 comprises an organic light-emitting material.

It should be understood that, the light interference of a specific wavelength can be enhanced by adjusting the thickness (also referred to as the optical length) of the microcavity structure in the light-emitting unit 10, so that the light-emitting unit 10 emits light with high brightness. For example, by adjusting the thickness of the microcavity structure in the light-emitting unit 10, the red light-emitting unit R will emit red light with high brightness, the green light-emitting unit G will emit green light with high brightness, and the blue light-emitting unit B will emit blue light with high brightness.

In the above embodiments, in the microcavity structure of the light-emitting unit 10, the refractive index of the light extraction layer 14 is smaller than the refractive index of the organic layer 23. In addition, in the encapsulation layer 20, the refractive index of the first inorganic layer 21, the refractive index of the third inorganic layer 24, and the refractive index of the organic layer decrease sequentially. Such a light-emitting unit 10 and encapsulation layer 20 may further improve the transmittance of light, thereby further improving the light-emitting efficiency of the light-emitting device.

The embodiments of the present disclosure also provide a display device. The display device comprises: a backplane BP and a plurality of pixel units located on one side (for example, an upper side) of the backplane BP. At least one of the plurality of pixel units may comprise the light-emitting device according to any of the above embodiments. For example, each pixel unit of the plurality of pixel units comprises the light-emitting device according to any of the above embodiments. It should be understood that, in the embodiments of the present disclosure, a pixel unit may also be referred to as a sub-pixel.

In some embodiments, the plurality of pixel units comprises a plurality of red pixel units R, a plurality of green pixel units G, and a plurality of blue pixel units B. In some embodiments, in the light-emitting device of each pixel unit, each layer in the third inorganic layer 24 has a thickness of $d=(2K+1)*\lambda/4$, where K is an integer, and $\lambda$ is a wavelength of blue light. In this way, the luminous efficiency of the entire display device can be improved by improving the luminous efficiency of the blue pixel unit B.

In some embodiments, the display device may be any product or member with a display function, such as a display panel, a mobile terminal, a television, a display (for example, a micro-display), a notebook computer, a digital photo frame, a navigator, or an electronic paper.

Figure 5:
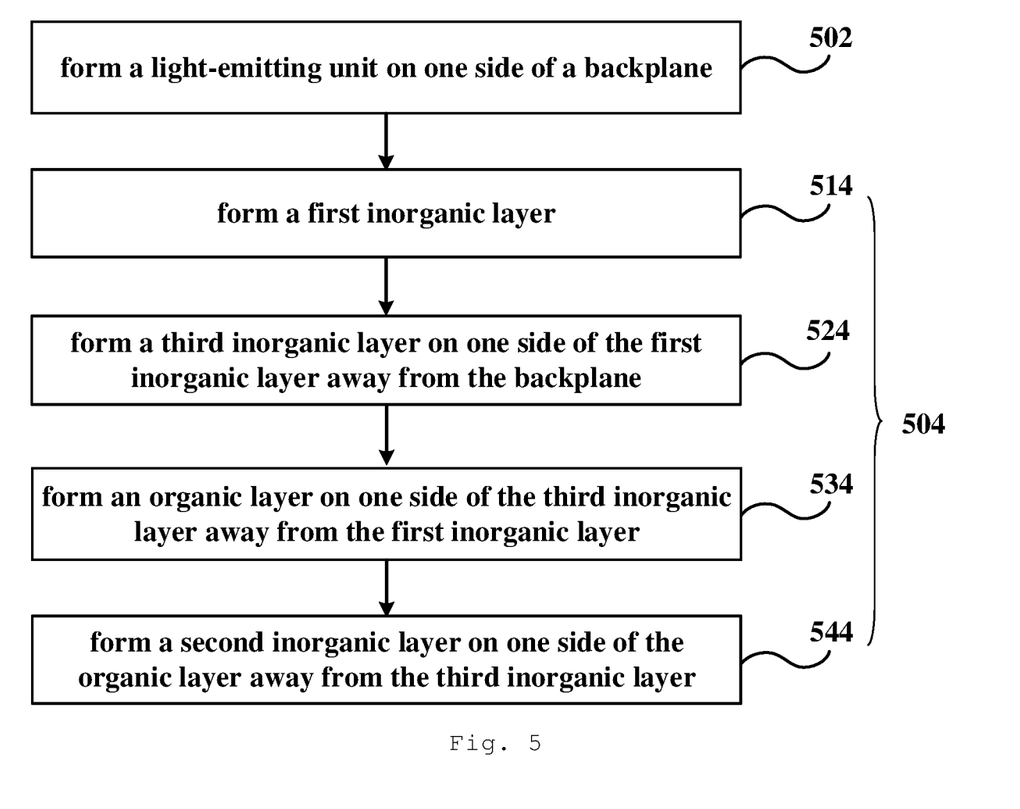
FIG. 5 is a schematic flow chart showing a manufacturing method of a light-emitting device according to an embodiment of the present disclosure.

FIG. 5 is a schematic flow chart showing a manufacturing method of a light-emitting device according to an embodiment of the present disclosure.

As shown in FIG. 5, the manufacturing method of a light-emitting device comprises step 502 and step 504.

At step 502, a light-emitting unit is formed on one side of a backplane. For example, the light-emitting unit may be an OLED. For example, the backplane may be formed by a Low Temperature Poly-silicon (LTPS) process.

At step 504, an encapsulation layer is formed on one side of the light-emitting unit away from the backplane.

Referring to FIG. 5, the step 504 may comprise steps 514 to 544.

At step 514, a first inorganic layer is formed.

For example, the first inorganic layer may be formed by using a chemical vapor deposition (CVD) process. For example, the material of the first inorganic layer may comprise silicon oxynitride.

At step 524, a third inorganic layer is formed on one side of the first inorganic layer away from the backplane.

For example, the third inorganic layer may be formed by using a CVD process. It should be understood that, the third inorganic layer comprising one or more layers may be formed by using a CVD process. The material of each layer of the third inorganic layer may comprise, for example, a nitride layer of silicon.

At step 534, an organic layer is formed on one side of the third inorganic layer away from the first inorganic layer.

For example, the organic layer may be formed by an inkjet printing process.

At step 544, a second inorganic layer is formed on one side of the organic layer away from the third inorganic layer.

For example, the second inorganic layer may be formed by using a CVD process.

The refractive index of the above first inorganic layer, the refractive index of the above third inorganic layer, and the refractive index of the above organic layer decrease sequentially.

In the light-emitting device formed by the above embodiments, in the encapsulation layer, the refractive index of the first inorganic layer, the refractive index of the third inorganic layer, and the refractive index of the organic layer decrease sequentially. Such an encapsulation layer is favorable for improving the transmittance of light, thereby improving the luminous efficiency of the light-emitting device. In addition, such an encapsulation layer 20 is also favorable for reducing the color shift of the light-emitting device.

In some embodiments, the power applied during the process of forming the third inorganic layer changes from a value not 0 to 0 at a certain time, so that the surface of the third inorganic layer in contact with the subsequent organic layer has a protrusion.

For example, at an initial time of forming the third inorganic layer, the applied power is 0. Then, the applied power gradually increases to a predetermined power greater than 0. After that, at a certain time, the applied power decreases to 0. Thereinafter, the applied power gradually increases from 0 to a predetermined power again.

Since the applied power changes from a value not 0 to 0 at a certain time, some substances that do not react completely may be deposited on an intermediate surface of the formed third inorganic layer, so that the surface roughness of the finally formed third inorganic layer changes. In this way, the surface roughness of the third inorganic layer can be increased.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display device, comprising a backplane and a plurality of pixel units located on one side of the backplane, the plurality of pixel units comprising a plurality of red pixel units, a plurality of green pixel units and a plurality of blue pixel units, and each of the plurality of pixel units comprising a light-emitting device, the light-emitting device comprising:
   a light-emitting unit located on one side of the backplane; and
   an encapsulation layer located on one side of the light-emitting unit away from the backplane, comprising:
      a first inorganic layer,
      a second inorganic layer located on one side of the first inorganic layer away from the backplane,
      an organic layer located between the first inorganic layer and the second inorganic layer, and
      a third inorganic layer located between the first inorganic layer and the organic layer, the third inorganic layer comprising at least one layer,
   wherein a refractive index of the first inorganic layer, a refractive index of the third inorganic layer, and a refractive index of the organic layer decrease sequentially,
   wherein in each of the plurality of red pixel units, the plurality of green pixel units and the plurality of blue pixel units, each layer of the at least one layer has a thickness of $d=(2K+1)*\lambda/4$, where K is an integer, and $\lambda$ is a wavelength of blue light, and
   wherein in each of the plurality of red pixel units, the plurality of green pixel units and the plurality of blue pixel units, a ratio of the thickness of each layer of the at least one layer to a thickness of the first inorganic layer ranges from 1:8 to 1:12.

2. The display device according to claim 1, wherein:
   each layer of the at least one layer having a refractive index of n1;

each layer of the at least one layer is adjacent to two layers of the first inorganic layer, the at least one layer and the organic layer, the two layers having refractive indices of n2 and n3 respectively; and an absolute value of a difference between $(n1)^2$ and $(n2 \times n3)$ is greater than or equal to 0, and smaller than 0.1.

3. The display device according to claim 2, wherein the at least one layer only comprises one layer.

4. The display device according to claim 2, wherein an absolute value of a difference between refractive indices of two adjacent layers of the first inorganic layer, the at least one layer and the organic layer ranges from 0.01 to 0.1.

5. The display device according to claim 4, wherein each layer of the at least one layer has the refractive index ranging from 1.45 to 1.76.

6. The display device according to claim 5, wherein the at least one layer comprises:
   a first layer having a refractive index ranging from 1.57 to 1.76; and
   a second layer located between the first layer and the organic layer, the second layer having a refractive index ranging from 1.45 to 1.55.

7. The display device according to claim 5, wherein:
   the first inorganic layer has the refractive index ranging from 1.7 to 2; and
   the organic layer has the refractive index ranging from 1.45 to 1.55.

8. The display device according to claim 1, wherein the thickness of each of the at least one layer ranges from 20 nanometers to 200 nanometers.

9. The display light emitting device according to claim 8, wherein the at least one layer comprises:
   a first layer having a thickness ranging from 50 nanometers to 200 nanometers; and
   a second layer located between the first layer and the organic layer.

10. The display device according to claim 8, wherein:
    the first inorganic layer has the thickness ranging from 500 nanometers to 1500 nanometers; and
    the organic layer has a thickness ranging from 4 micrometers to 16 micrometers.

11. The display device according to claim 1, wherein a material of the third inorganic layer comprises silicon oxynitride.

12. The display device according to claim 11, wherein a material of the first inorganic layer comprises silicon oxynitride.

13. The display device according to any of claim 1, wherein the light-emitting unit comprises a microcavity structure, the microcavity structure comprising:
    an anode located on the one side of the backplane;
    a light-emitting layer located on one side of the anode away from the backplane;
    a cathode located on one side of the light-emitting layer away from the anode; and
    a light extraction layer located on one side of the cathode away from the light-emitting layer, wherein a refractive index of the light extraction layer is smaller than the refractive index of the organic layer.

14. The display device according to any of claim 1, wherein a surface of the third inorganic layer in contact with the organic layer has a protrusion.

15. The display device according to claim 14, wherein contour arithmetic mean deviation of the surface is greater than 10 nanometers.

16. A manufacturing method of a display device, the display device comprising a backplane and a plurality of pixel units located on one side of the backplane, the plurality of pixel units comprising a plurality of red pixel units, a plurality of green pixel units and a plurality of blue pixel units, and each of the plurality of pixel units comprising a light-emitting device, forming the light-emitting device comprising:
    forming a light-emitting unit on one side of the backplane; and
    forming an encapsulation layer on one side of the light-emitting unit away from the backplane, comprising:
        forming a first inorganic layer,
        forming a third inorganic layer on one side of the first inorganic layer away from the backplane, the third inorganic layer comprising at least one layer,
        forming an organic layer on one side of the third inorganic layer away from the first inorganic layer, and
        forming a second inorganic layer on one side of the organic layer away from the third inorganic layer,
    wherein a refractive index of the first inorganic layer, a refractive index of the third inorganic layer, and a refractive index of the organic layer decrease sequentially,
    wherein in each of the plurality of red pixel units, the plurality of green pixel units and the plurality of blue pixel units, each layer of the at least one layer has a thickness of $d=(2K+1)*\lambda/4$, where K is an integer, and $\lambda$ is a wavelength of blue light, and
    wherein in each of the plurality of red pixel units, the plurality of green pixel units and the plurality of blue pixel units, a ratio of the thickness of each layer of the at least one layer to a thickness of the first inorganic layer ranges from 1:8 to 1:12.

17. The manufacturing method according to claim 16, wherein forming the third inorganic layer comprises:
    forming the third inorganic layer by using a chemical vapor deposition process, wherein a power applied during a process of forming the third inorganic layer changes from a value not 0 to 0 at a certain time, so that a surface of the third inorganic layer in contact with the organic layer has a protrusion.

* * * * *

UNITED STATES PATENT AND TRADEMARK OFFICE
CERTIFICATE OF CORRECTION

PATENT NO. : 12,490,584 B2  
APPLICATION NO. : 17/788635  
DATED : December 2, 2025  
INVENTOR(S) : Baoke He et al.

Page 1 of 1

It is certified that error appears in the above-identified patent and that said Letters Patent is hereby corrected as shown below:

In the Claims

Column 11, Line 32, Claim 9, delete "display light emitting" and insert -- display --

Signed and Sealed this  
Twentieth Day of January, 2026

John A. Squires  
*Director of the United States Patent and Trademark Office*